(12) United States Patent
Ashby (10) Patent No.: US 6,587,907 B1
(45) Date of Patent: Jul. 1, 2003

(54) SYSTEM AND METHOD FOR GENERATING A CLOCK DELAY WITHIN AN INTERCONNECT CABLE ASSEMBLY

(75) Inventor: Wayne C. Ashby, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/561,590

(22) Filed: May 1, 2000

(51) Int. Cl.⁷ .............................................. G06F 13/00
(52) U.S. Cl. ........................ 710/300; 713/401; 361/748
(58) Field of Search ................................. 710/100, 300, 710/305; 413/400, 500, 503, 401; 714/700; 361/748; 327/153; 375/295, 316, 257, 355, 356; 326/40, 41, 93; 340/286.01

(56) References Cited

U.S. PATENT DOCUMENTS 3,852,723 A * 12/1974 Wu
6,078,623 A * 6/2000 Isobe et al.
6,219,384 B1 * 4/2001 Kliza et al.

* cited by examiner

Primary Examiner—Gopal C. Ray (57) ABSTRACT

A driving integrated circuit in electrical connection with a first printed circuit board. A memory device is in electrical connection with a receiving integrated circuit, which is electrically connected with a second printed circuit board. The driving integrated circuit and the memory device each include a data port and a clock port. A data line electrically connects the first port of the printed circuit board with the first port of the second printed circuit board for transmitting a data signal. A clock line electrically connects the second port of the first printed circuit board with the second port of the second printed circuit board for transmitting a clock signal associated with the data signal. The clock line has a length greater than a length of the data line such that a time delay is introduced into the clock signal passing from the driving integrated circuit to the receiving integrated circuit.

24 Claims, 4 Drawing Sheets

SYSTEM AND METHOD FOR GENERATING A CLOCK DELAY WITHIN AN INTERCONNECT CABLE ASSEMBLY

THE FIELD OF THE INVENTION

The present invention relates to generating a delay for a clock signal of a data signal/clock signal pair; and more specifically, relates to introducing a delay to a clock signal of a data signal/clock signal pair within an interconnect cable connecting a first printed circuit board to a second printed circuit board.

BACKGROUND OF THE INVENTION

In computer systems, in is often necessary to interconnect or "link" electrical components or integrated circuits located on separate printed circuit boards. Most often, a pipelined data bus facilitates passing data and its associated synchronous clock signal through an interconnect cable between printed circuit boards. To maximize performance, especially in high frequency bus link applications, it is important to precisely generate a clock delay in the clock signal relative to the associated data signal in order to ensure that the data is stable at the receiving data capture latch during the clock transition at the receiving integrated circuit. If a delay is not introduced into the clock signal, the data signal and clock signal, a memory device electrically connected to the receiving integrated circuit may capture unstable data, which has an overall detrimental effect on the computer system. In order to provide a stable data signal, it is necessary to maximize both the data set up time and the data hold time for the memory device at the receiving ends.

There are several prior art solutions for introducing a delay within a clock signal. Prior art solutions traditionally generate the clock delay using discrete delay-line components or by adding length to the clock trace (etch) in the printed circuit boards. However, these prior solutions have corresponding disadvantages which make these solutions undesirable.

Board trace impedance and propagation speed tolerances are effected by over/under trace etching during the fabrication process and by printed circuit board dielectric material variations. In addition, deviations from the desired trace impedance may produce signal reflections which degrade timing and noise margins. In addition, variations in propagation speed affect timing margins.

Delay-line components used for providing the clock delay relative to its associated data is undesirous in that the delay-line components are mounted to the outside of a printed circuit board requiring exit vias and mounting pads in the printed circuit board. In addition, delay line components also produce parasitic capacitive and inductive effects on timing and noise margins. For fast edge-rate clocks, either delay-line components or additional trace etches in the printed circuit board can have significant high frequency signal attenuation effects due to dielectric loss and "skin-loss" effects in the conductor, thus degrading the clock edge-rate and amplitude.

Further, trace etch delays are frequency dependent. If the frequency of the computer system is later changed or altered, trace etch delays within a printed circuit board no longer provide the desired delay necessary to properly capture stable data at the receiving printed circuit board. Therefore, the printed circuit board must be redesigned and replaced, which is an expensive procedure.

Therefore, there is a need for a connection scheme which will simply and efficiently provides a clock delay relative to an associated data signal. The clock delay must be designed in such a manner than the clock delay can be modified or revised due to a system frequency change in an efficient and reliable manner. In addition, the clock delay must not be effected by the fabrication process of various printed circuit boards.

SUMMARY OF THE INVENTION

The present invention includes a system and method for providing data between a first printed circuit board and a second printed circuit board. The system includes a driving integrated circuit in electrical connection with the first printed circuit board, the driving integrated circuit having a data port and a clock port. A receiving circuit is in electrical connection with the second printed circuit board data capture. A memory device, such as a flip-flop or latch for example, is in electrical connection with the receiving integrated circuit, wherein the memory device has a data input port and a clock input port. An interconnect cable electrically connects the first printed circuit board to the second printed circuit board. The interconnect cable includes at least one data line electrically connecting the first port of the first printed circuit board with the first port of the second printed circuit board for transmitting a data signal. The data line has a predetermined length. The interconnect cable also includes at least one clock line electrically connecting the second port of the first printed circuit board with the second port of the second printed circuit board for transmitting a clock signal associated with a corresponding data signal. The clock line has a length which is greater than the length of the data line such that a time delay is introduced into the clock signal passing between the first and second printed circuit boards.

In one embodiment, the system further includes a first data interconnect electrically connecting the data port of the driving integrated circuit to a first port of the first printed circuit board, while a first clock interconnect electrically connects the clock port of the driving integrated circuit to a second port of the first printed circuit board. Similarly, a second data interconnect electrically connects a first port of the second printed circuit board with the data port of the memory device, while a second clock interconnect electrically connects a second port of the second printed circuit board with the clock port of the memory device.

In another embodiment, the data capture memory device is a latch, while in yet another embodiment, the memory device is a flip-flop. Further, in one embodiment, the first data interconnect and the first clock interconnect have substantially equal lengths. Similarly, the second data interconnect and a second clock interconnect have substantially equal lengths, thereby preventing signal mismatch due to line impedance in these interconnects.

In another embodiment, the memory device is a rising edge sensitive clocking memory device which captures the data signal corresponding to a rising edge of a clock signal. In yet another embodiment the memory device is a falling edge sensitive clocking memory device which captures a data signal corresponding to a falling edge of the clock signal. In either embodiment, the delay time introduced into the clock signal ensures that the memory device captures and holds a stable data signal, as opposed to a transitioning data signal.

The method of the present invention includes transmitting a synchronized data signal and an associated clock signal to a data port and a clock port, respectively, of a first printed circuit board. The data signal is transmitted to a data port of the second printed circuit board via a data line of an interconnect cable, the data line having a predetermined length. A time delay is introduced into the clock signal during transmission of the clock signal to a clock port of a second printed circuit board, thereby creating a delayed clock signal. The clock signal transmitted between the first and second printed circuit board via a clock line of the interconnect cable. The clock line also has a predetermined length, which is greater than the predetermined length of the data line. The data signal and the delayed clock signal is transmitted to a data port and a clock port, respectively, of a memory device in electrical connection with the second printed circuit board. A stable data signal is captured and held within the memory device when an associated delay clock signal changes states at the clock port of the memory device.

In one embodiment, the stable data signal is captured within a rising edge sensitive clocking memory device corresponding to a rising edge of the associated delay clock signal at the clock port of the memory device. In another embodiment, the stable data signal is captured within a falling edge sensitive clocking memory device corresponding to a falling edge of the associated delay clock signal at the clock port of the memory device.

DESCRIPTION OF THE PREFERRED EMBODIMENTS the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

In computer systems, it is often necessary to interconnect or "link" printed circuit boards together using a pipelined data bus which passes data signals and their associated synchronous clock signals through an interconnect cable. To maximize performance, especially in high frequency bus link applications, it is important to precisely position a clock delay within the clock signal relative to its associated data signal in order to maximize both data set up time and data hold time for a memory device at the receiving end. If a delay is not introduced into the clock signal, the data signal and associated clock signal will simultaneously change states at the input of the memory device. The memory device will capture unstable data, which has an overall detrimental effect on the computer system, as is known in the art.

Figure 1:
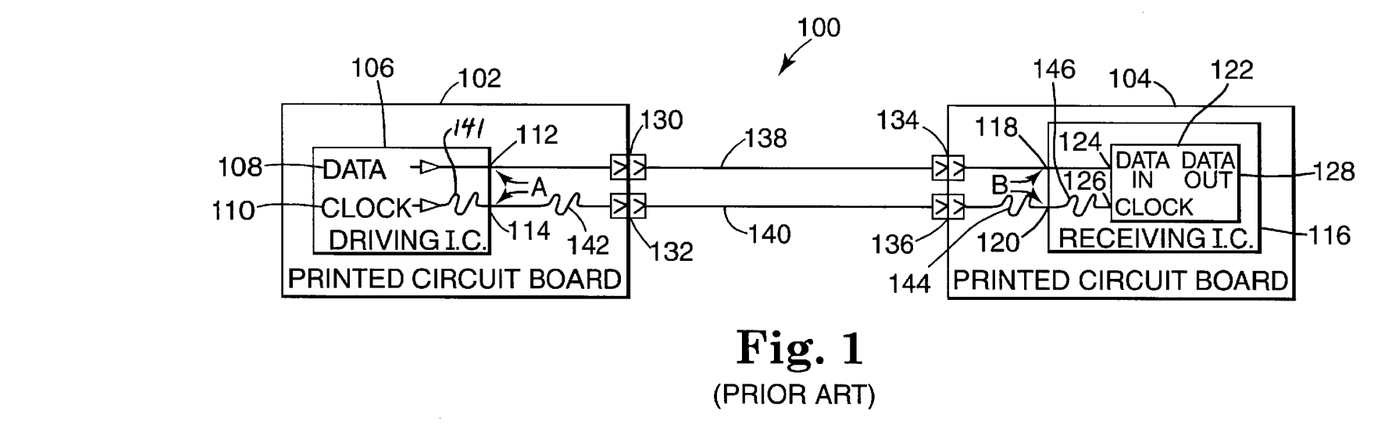
FIG. 1 is a block diagram illustrating a prior art design for transmitting a data signal and an associated clock signal between data and clock ports of a driving integrated circuit and data and clock ports of a memory device.

FIG. 1 is a block diagram of prior art system 100. Prior art system 100 includes printed circuit boards 102 and 104. Printed circuit board 102 further includes driving integrated circuit 106 having data 108, clock 110, data port 112, and clock port 114. Printed circuit board 104 further includes receiving integrated circuit 116 having data port 118 and clock port 120, and a memory device 122 having data port 124, clock port 126 and data port 128. Printed circuit board 102 further includes data port 130 and clock port 132, while printed circuit board 104 further includes data port 134 and clock port 136. System 100 also includes data line 138 and clock line 140 interconnecting printed circuit boards 102 and 104. In one embodiment, data line 138 and clock line 140 are enclosed within an interconnect cable interconnecting printed circuit boards 102 and 104.

Memory device 122 captures and holds a logic signal, such as a logic 0 or a logic 1. The captured data signal is then "passed" out of memory element 122 via data port 128 to other electrical components of prior art system 100. It is important to system 100 that stored within memory device 122 is a stable data signal. As is known in the art, the data signal logic value coming in to data port 124 of memory device 122 is recognized at clock edge events at clock port 126. For example, in a rising (positive) edge sensitive clocking memory device, a data signal logic value at data port 124 corresponding to a rising edge of a clock signal at clock port 126 will be captured and held within memory device 122. This data signal logic value will remain in memory device 122 until memory device 122 recognizes another rising edge of the clock signal at clock port 126. The captured data signal logic value within memory device 122 will be forwarded from data port 128 of memory device 122 to another electrical component. This procedure of capturing and holding data corresponding to a rising edge of a clock signal is indefinitely repeated. The clock going to the memory device 122 may also be called a strobe.

Similarly, with respect to a falling (negative) edge sensitive clocking memory device, rather than a rising edge design, a data signal logic value at data port 124 corresponding to a falling edge of a clock signal at clock port 126 will be captured and stored within memory device 122. This data signal will remain in memory device 122 until memory device 122 recognizes another falling edge of the clock signal at clock port 126. The captured logic value data signal within memory device 122 will be forwarded from data port 128 of memory device 122 to another electrical component. This procedure of capturing and holding data corresponding to a falling edge of a clock signal is indefinitely repeated.

In order to reliably capture the proper data logic value, memory device 122 has a minimum data input set up and hold time requirement wherein the input data must be stable. A data set up time is defined as the time interval between when the data signal changes states from a logic 0 to a logic 1 or a logic 1 to a logic 0 and the time when memory device 122 captures the data signal. The data hold time is defined as the time interval between the capture of the data signal and when a change in logic state for the new data signal occurs. A delay mechanism must be introduced into clock line 140 such that a data capture event, such as a rising edge or a falling edge of the clock signal (depending on the type of system) does not violate the data setup and hold time requirement of the data on data line 138, such as from a logic 0 to a logic 1 or a logic 1 to a logic 0. If no delay is introduced, memory device 122 will attempt to capture data which is in an unstable state transitioning between logic signals. Without any delay components, data signals and clock signals are moving along lines 138 and 140 in parallel at the same rate of speed since the material of lines 138 and 140 are closely matched.

As shown in FIG. 1, prior art system 100 includes several possible delay mechanisms on clock line 140. In particular, additional lines 141, 142, 144, and 146 are included in clock line 140. Additional lines 141, 142, 144, and 146 represent either additional wiring, additional traces, or etching in either printed circuit boards 102 and 104 or in transmitting circuit 106 or in receiving circuit 116. Additional lines 141, 142, 144 and/or 146 each introduce a time delay for a clock signal propagating between printed circuit boards 102 and 104. A longer additional line equates to a greater time delay. The proper length of additional lines 141, 142, 144, and 146 necessary to create a desired time delay can be identified by testing system 100, as is known in the art. It is understood that one or more of additional lines 141, 142, 144, and 146 can be utilized to generate the optimal time delay.

Figure 2:
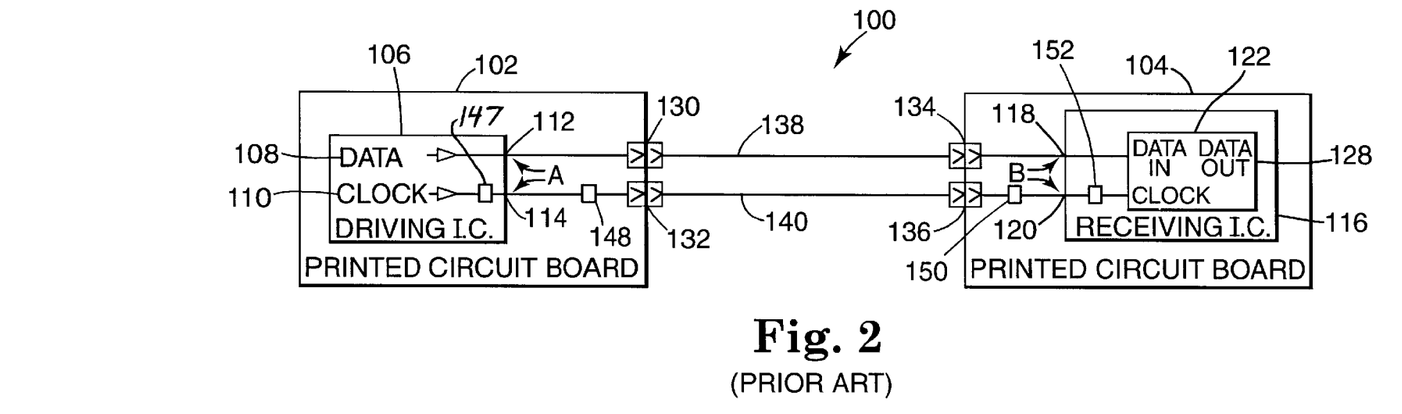
FIG. 2 is a block diagram illustrating a second prior art design for transmitting a data signal and an associated clock signal between data and clock ports of a driving integrated circuit and data and clock ports of a memory device.

FIG. 2 is identical to FIG. 1 except that additional lines 141, 142, 144, and 146 have been replaced with delay elements 147, 148, 150, and 152. All other identical components have been labeled as such. Delay elements 147, 148, 150, and 152 each introduce a time delay for a clock signal propagating between printed circuit boards 102 and 104. Delay element 147, 148, 150, and 152 may be any electrical component which introduces a time delay to the clock signal, as is known in the art. It is understood that one or more of delay elements can be utilized to generate the optimal time delay. Prior art delays introduced by additional lines 141, 142, 144, or 146 or delay element 147, 148, 150, or 152 have an error window of greater than 5 percent and sometimes 10 percent.

The prior art solution shown in FIGS. 1 and 2 have numerous disadvantages. One disadvantage of the printed circuit board trace shown as additional lines 142 and 144 in FIG. 1 is that impedance tolerance of these the board traces are affected by over/under trace etching during the fabrication process and by board dielectric material variations. Deviation from the desired trace impedance causes signal reflections which degrade timing and noise margins. In addition, variations and propagation speed affect due to variations in the board dielectric material timing margins. In addition, if the frequency of system 100 is later changed, trace etch delays require a board revision to optimize the timing margin for the new frequency. This is costly to implement. Similarly, delay elements 148 and 150 are mounted to the outside of printed circuit boards 102 and 104 or integrated circuit 116. Extra vias and mounting pads in printed circuit boards 102 and 104 or integrated circuit 116 create parasitic capacitive and inductive effects on timing and noise margins. With respect to fast edge-rate clocks, both delay line components and additional trace etches in a printed circuit board can have significant high frequency signal attenuation effects due to dielectric loss and "skin loss" effects in the clock line, thus degrading the clock etch-rate and amplitude.

Figure 3:
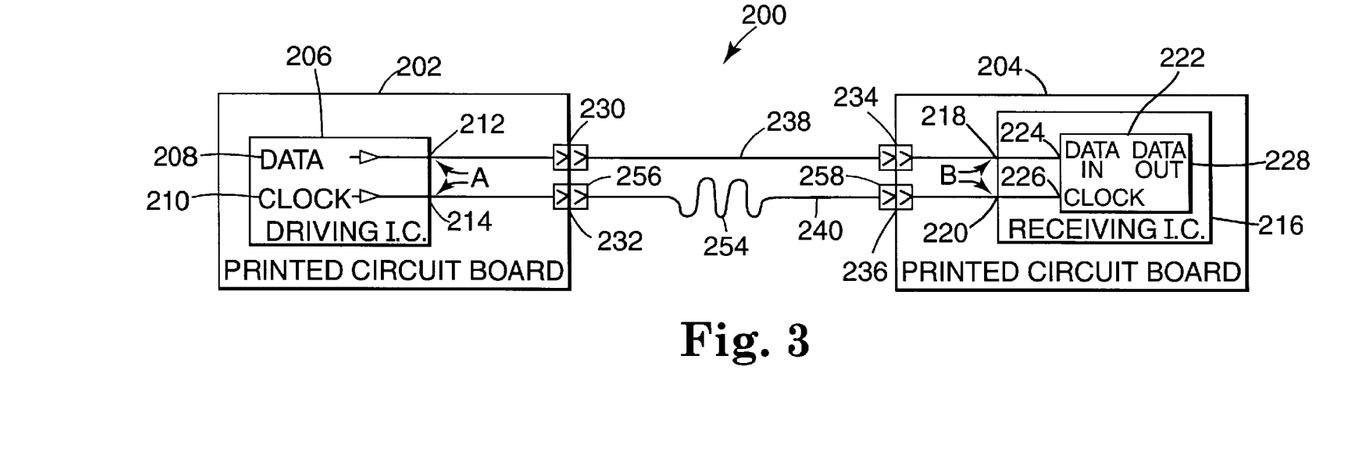
FIG. 3 is a block diagram illustrating one embodiment of the present invention for transmitting a data signal and an associated clock signal between data and clock ports of a driving integrated circuit and data and clock inputs of a memory device.

FIG. 3 illustrates system 200 incorporating the present invention. System 200 is similar to system 100, therefore all like components have been labeled with similar numbers by adding 100 to each number. For example, printed circuit boards 202 and 204 of FIG. 3 are identical to printed circuit boards 102 and 104 of FIGS. 1 and 2.

As shown in FIG. 3, all delay elements previously shown and discussed with reference to FIGS. 1 and 2 have been removed. Thus, all of the disadvantages of additional lines 141, 142, 144, and 146 and delay elements 147, 148, 150, and 152 are removed from system 200. System 200 introduces a delay between clock 210 of driving integrated circuit 206 and clock port 226 of memory device 222 by introducing additional length of clock line 254 to clock line 240 between clock port 232 of printed circuit board 202 and clock port 236 of printed circuit board 204. Additional length of clock line 254 provides the necessary delay for a clock signal transmitted on clock line 240 since a clock signal propagating down clock line 240 from clock 210 of driving integrated circuit 206 will take a longer period of time to reach clock port 226 of memory device 222 as compared to a data signal propagating down data line 238 from data 208 of driving integrated circuit 206 to data port 224 of memory device 222. It is understood that data line 238 and clock line 240 are fabricated from substantially identical materials such as an insulated and shielded conductor or a copper wire such that a data signal and a corresponding clock signal will propagate down data line 238 and clock line 240 at the same time interval, assuming additional wire 254 is not present.

The exact length of clock line 240 having additional wire 254 as compared to data line 138 can be determined by means known in the art such that a proper time delay is incorporated into clock line 240. In one preferred embodiment, the length of clock line 240 is greater than the length of data line 238 to impose the data desired clock delay. Additional wire 254 ensures that data captured at data port 224 of memory device 222 is in a stable state when the corresponding clock signal is input into clock port 226. Thus, the balance between the data set up time and data hold time of the captured data signal, as previously defined, are optimized and any internal logic elements of memory devices 222 are stable and reliably hold the captured data signal.

In one preferred embodiment, memory device 222 is a latch, such as a capture latch. In another preferred embodiment, memory device 222 is a flip-flop. In another embodiment, the data line between data port 212 of driving integrated circuit 206 and data port 230 of printed circuit board 202 is a conductive trace. Likewise, the clock line between clock port 214 of driving integrated circuit 206 and clock port 232 of printed circuit board 202 is a conductive trace. Further, in one embodiment, the two conductive traces are approximately equal in length to minimize signal mismatch. In another embodiment, the data line between data port 234 of printed circuit board 204 and data port 224 of memory device 222 is a conductive trace. Likewise, the clock line between clock port 236 of printed circuit board 204 and clock port 226 of memory device 222 is a conductive trace. Further, in one embodiment, the two conductive traces are approximately equal in length to minimize signal mismatch.

As previously mentioned, positioning a delay between printed circuit boards 202 and 204 eliminates various disadvantages of prior art designs. For example, extra wire 254 is not affected by over/under trace etching during the fabrication process and by printed circuit board material variations. In addition, additional wire 254 does not require exit vias and mounting pads in printed circuit boards 202 and 204 which produce parasitic capacitive and inductive effects on timing and noise margins. Finally, a significant advantage over the prior art is that the location of extra wire 254 does not require a printed board revision if the frequency of system 200 is later changed. Rather, clock line 240 between printed circuit boards 202 and 204 can be disconnected at connectors 256 and 258 and a new clock line can be inserted having a proper extra length of wire 254 to ensure stabilized data capture within memory device 222. Replacement of clock line 240 is a simple procedure which does not require a significant time commitment.

Figure 4:
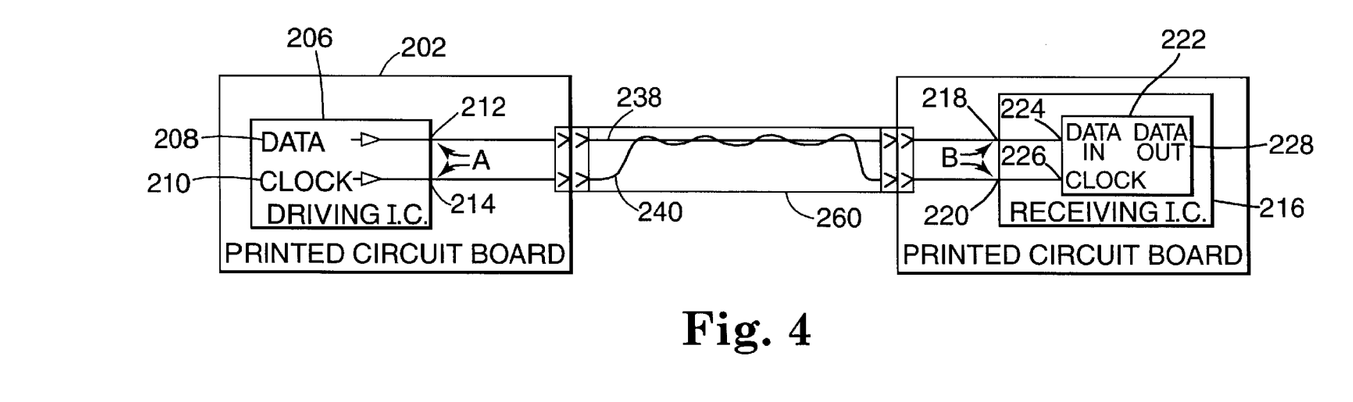
FIG. 4 is a block diagram illustrating another preferred embodiment for transmitting a data signal and an associated clock signal between data and a clock ports of a driving integrated circuit and data and clock ports of a memory device.

FIG. 4 shows an alternate embodiment of the present invention. As shown in FIG. 4, the additional length of wire is spirally wrapped around data line 238 such that clock line 240 has a greater length than that of data line 238. If the frequency of system 200 is later changed, interconnect cable 260 can be disconnected at connectors 262 and 264 and a new interconnect cable can be inserted having the proper length ratio between data line 238 and clock line 240 to ensure stabilized data capture within memory device 222. Replacement of interconnect cable 260 is a simple procedure which does not require a significant time commitment. It is understood that other embodiments which provide for increased length of clock line 240 as compared to data line 138 may be designed and inserted between printed circuit boards 202 and 204 without deviating from the present invention. The present invention only requires that clock line 240 has a length which is different than data line 238. For example, data line 238 could be longer than clock line 240 and still provide the proper timing such that memory device 222 captures stable data corresponding to a change in state of a clock signal at clock port 226.

The time delay introduced by the present design shown in FIGS. 3 and 4 can achieve an error window of less than 5 percent, and even less than 2 percent is possible with high quality cables.

Figure 5:
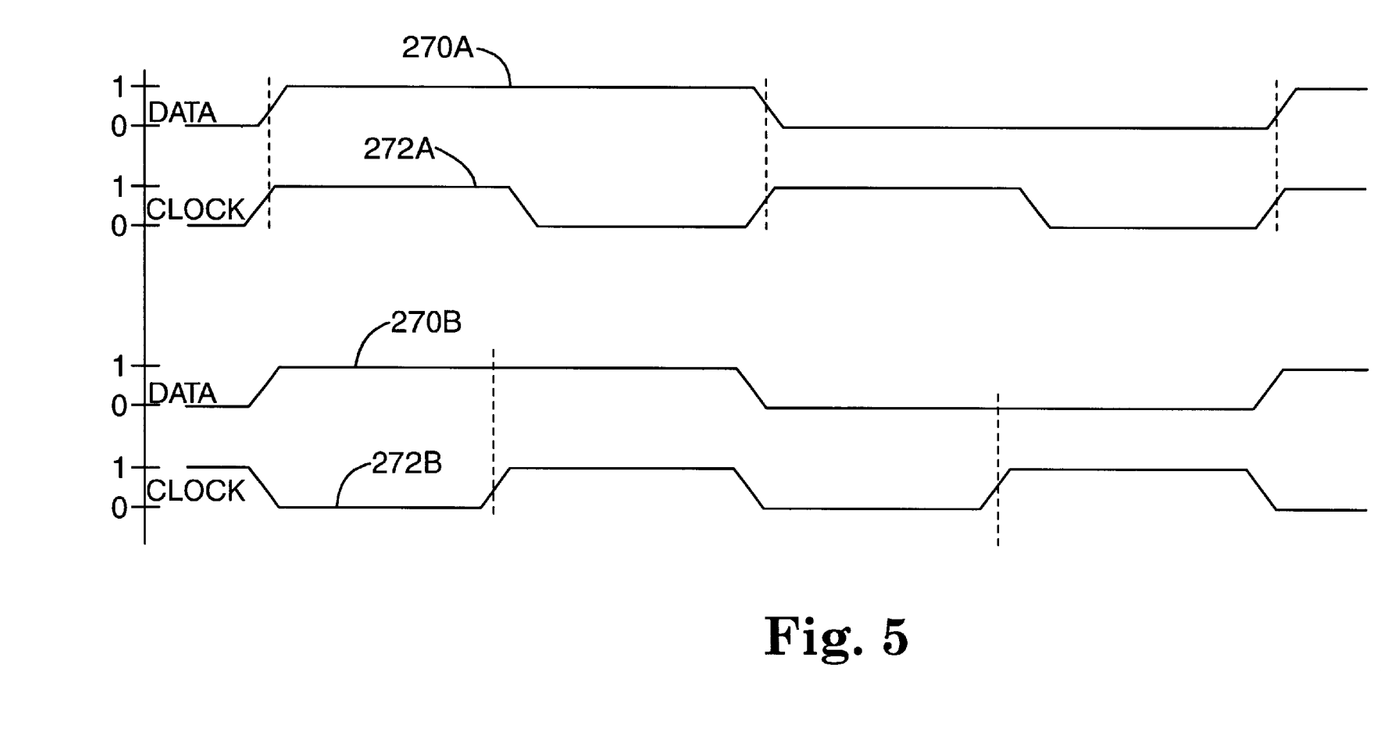
FIG. 5 is a timing diagram illustrating a rising edge timing scheme for the data signal and the associated clock signal.
Figure 6:
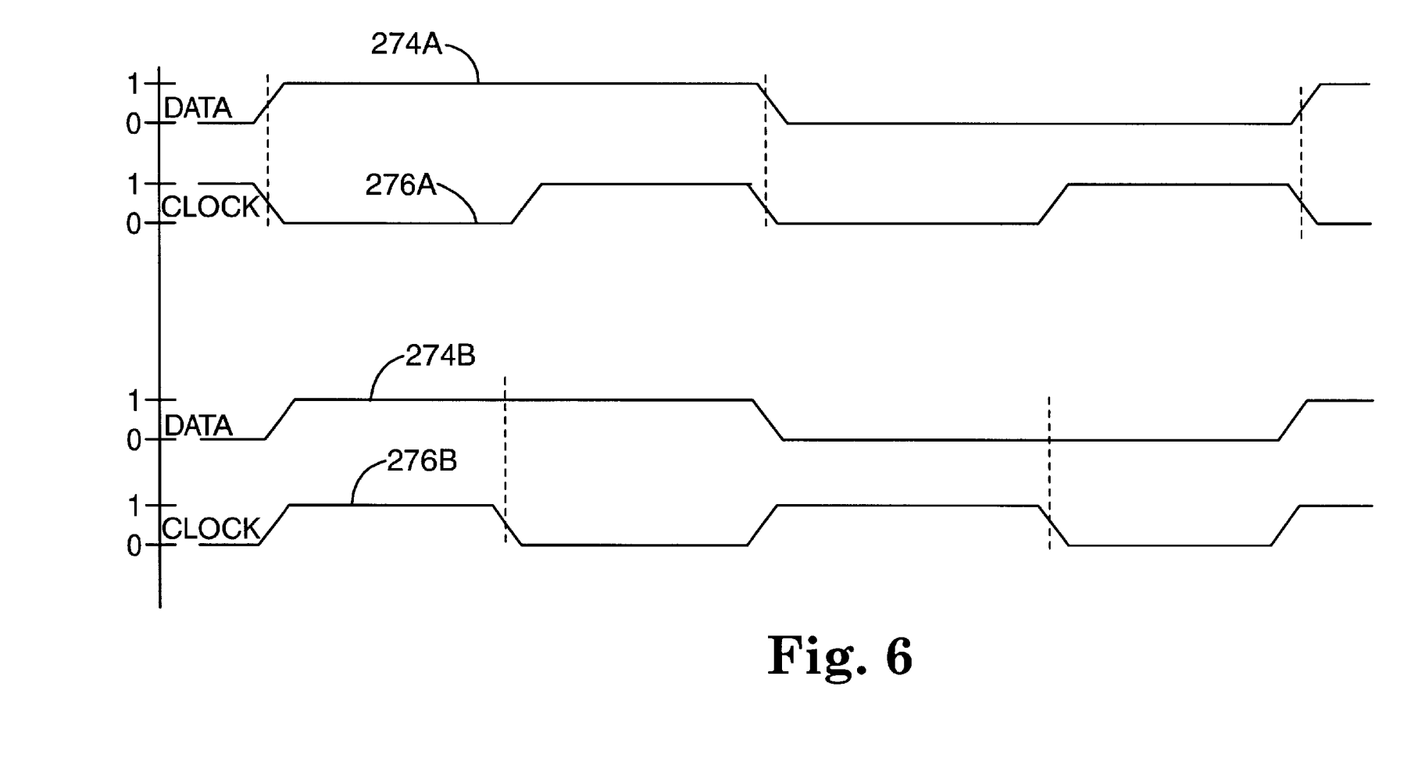
FIG. 6 is a timing diagram illustrating a falling edge timing scheme for a data signal and an associated clock signal.

FIGS. 5 and 6 are timing diagrams illustrating data and clock signals at points A and B of FIGS. 3 and 4. FIG. 5 represents a timing diagram of a rising edge sensitive clocking memory device while FIG. 6 represents a timing diagram of a falling edge sensitive clocking memory device.

As shown in FIG. 5, data signal 270, at point A, changes state from a logic 0 to a logic 1 or from a logic 1 to a logic 0, with each rising edge of clock signal 272A. However, at point B of FIGS. 3 and 4, data signal 270B is stabilized at a rising edge of clock signal 272B, as desired. Thus, at each rising edge of clock signal 272B, a stabilized signal is captured and held in memory device 222. The additional length of clock line 240, as compared to data line 238, provides the time shift of clock signal 272A to 272B.

FIG. 6 illustrates timing diagrams which are identical to those of FIG. 5, except that the timing signals of FIG. 6 represent a timing signal of a falling edge sensitive clocking memory device rather than a rising edge sensitive clocking memory device. Thus, at point A in FIGS. 3 and 4, data signal 274A changes state corresponding to a falling edge of clock signal 276A. However, at point B in FIGS. 3 and 4, a stabilized data signal is 276B captured and held within memory device 222 at each falling edge of clock signal 276B. The additional length of line of clock line 240, as compared to data line 238, provides the time shift of clock signal 276A to 276B.

The present invention provides an overall system which is capable of transmitting corresponding data and clock signals between printed circuit boards of an overall system and ensure that the data signals captured and held in a memory device are stable signals having maximum data set up and data hold times. In addition, the present invention provides an easy solution to the issue of a change in frequency of the overall system after manufacture of the system. More specifically, the present invention provides data and clock lines within an interconnect cable which is not subject to the over/under etching problems realized in board traces. In addition, no additional board vias are needed, as compared to prior art on board delay line components.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A system for providing data between a first printed circuit board and a second printed circuit board, the first and second printed circuit boards each having a data port and a clock port, the system comprising:

a driving integrated circuit in electrical connection with the first printed circuit board, the driving integrated circuit including a data port and a clock port;

a receiving integrated circuit in electrical connection with the second printed circuit board;

a memory device in electrical connection with the receiving integrated circuit, the memory device including a data port and a clock port;

an interconnect cable electrically connecting the first printed circuit board to the second printed circuit board, the interconnect cable further comprising:

at least one data line electrically connecting the data port of the first printed circuit board with the data port of the second printed circuit board for transmitting a data signal, the data line having a length; and at least one clock line electrically connecting the clock port of the first printed circuit board with the clock port of the second printed circuit board for transmitting a clock signal associated with a corresponding data signal, the clock line having a length greater than the length of the corresponding data line such that a time delay is introduced into the clock signal passing from the driving integrated circuit to the receiving integrated circuit.

2. The system of claim 1, wherein the memory device is a latch.

3. The system of claim 1, wherein the memory device is a flip-flop.

4. The system of claim 1, wherein the memory device is a rising edge sensitive clocking memory device which captures the data signal at the data port corresponding to a rising edge of a corresponding clock signal at the clock port.

5. The system of claim 1, wherein the memory device is a falling edge sensitive clocking memory device which captures the data signal at the data port corresponding to a falling edge of a corresponding clock signal at the clock port.

6. The system of claim 1, and further comprising:
a first data interconnect electrically connecting the data port of the driving integrated circuit to the data port of the first printed circuit board;
a first clock interconnect electrically connecting the clock port of the driving integrated circuit with the clock port of the first printed circuit board;
a second data interconnect electrically connecting the data port of the second printed circuit board with the data port of the memory device; and
a second clock interconnect electrically connecting the clock port of the second printed circuit board with the clock port of the memory device.

7. The system of claim 6, wherein the first data interconnect and the first clock interconnect further comprises:
matched first and second traces having approximately equal lengths.

8. The system of claim 6, wherein the second data interconnect and the second clock interconnect further comprises:
matched first and second traces having approximately equal lengths.

9. An apparatus for electrically connecting a data port of a first printed circuit board to a data port of a second printed circuit board and for electrically connecting a clock port of the first printed circuit board to a clock port of the second printed circuit board, the apparatus comprising:
a data line electrically connected between the data port of the first printed circuit board and the data port of the second printed circuit board, the data line having a length;
a first trace electrically connecting a data port of a driving integrated circuit with the data port of the first printed circuit board;
a second trace electrically connecting a clock port of the driving integrated circuit with the clock port of the first printed circuit board; and
a clock line electrically connected between the clock port of the first printed circuit board and the clock port of the second printed circuit board, the clock line having a length greater than the length of the data line such that a time delay is introduced into a clock signal transmitted on the clock line, thereby maximizing a data set up time and a data hold time of an associated data signal transmitted on the data line.

10. The apparatus of claim 9, wherein the first and second traces have approximately equal lengths.

11. An apparatus for electrically connecting a data port of a first printed circuit board to a data port of a second printed circuit board and for electrically connecting a clock port of the first printed circuit board to a clock port of the second printed circuit board, the apparatus comprising:
a data line electrically connected between the data port of the first printed circuit board and the data port of the second printed circuit board, the data line having a length;
a clock line electrically connected between the clock port of the first printed circuit board and the clock port of the second printed circuit board, the clock line having a length greater than the length of the data line such that a time delay is introduced into a clock signal transmitted on the clock line, thereby maximizing a data set up time and a data hold time of an associated data signal transmitted on the data line;
a first trace electrically connecting the data port of the second printed circuit board to a data port of a memory device; and
a second trace electrically connecting the clock port of the second printed circuit board to a clock port of the memory device.

12. The apparatus of claim 11, wherein the memory device further comprises a latch.

13. The apparatus of claim 11, wherein the memory device further comprises a flip-flop.

14. The apparatus of claim 11, wherein the memory device is a rising edge sensitive clocking memory device which captures a data signal at the data port corresponding to a rising edge of a corresponding clock signal at the clock port.

15. The apparatus of claim 11, wherein the memory device is a falling edge sensitive clocking memory device which captures a data signal at the data port corresponding to a falling edge of a corresponding clock signal at the clock port.

16. The apparatus of claim 11, wherein the first and second traces have approximately equal lengths.

17. A method of passing a data signal between a driving integrated circuit in electrical connection with a first printed circuit board and an active edge sensitive clocking memory device in electrical connection with a second printed circuit board, the method comprising:
providing a direct electrical connection between a data port of the driving integrated circuit and a data port of the memory device for a data signal;
providing a delayed electrical connection between a clock port of the driving integrated circuit and a clock port of the memory device for a clock signal associated with the data signal, wherein the clock signal is time delayed between the first and second printed circuit boards; and
capturing a stable data signal within the memory device when an active edge of an associated delayed clock signal is located at the clock port of the memory device.

18. The method of 17, wherein the step of capturing the stable data signal within the memory device further comprises:
capturing a stable data signal within a rising edge sensitive clocking memory device when a rising edge of an associated delayed clock signal is located at the clock port of the memory device.

19. The method of 17, wherein the step of capturing the stable data signal within the memory device further comprises:
capturing a stable data signal within a falling edge sensitive clocking memory device when a falling edge of an associated delayed clock signal is located at the clock port of the memory device.

20. A method of passing a data signal between a driving integrated circuit in electrical connection with a first printed circuit board and a memory device in electrical connection with a second printed circuit board, the method comprising:
providing a direct electrical connection between a data port of the driving integrated circuit and a data port of the memory device for a data signal;
providing a delayed electrical connection between a clock port of the driving integrated circuit and a clock port of the memory device for a clock signal associated with the data signal, wherein the clock signal is time delayed between the first and second printed circuit boards;
transmitting a data signal between the first and second printed circuit boards via a data line having a length;
transmitting a clock signal between the first and second printed circuit boards via a clock line having a length such that the length of the clock line is greater than the length of the data line; and capturing a stable data signal within the memory device when an associated delayed clock signal changes states at the clock port of the memory device.

21. A method of transmitting a data signal from a driving integrated circuit in electrical connection with a first printed circuit board to a memory device in electrical connection with a second printed circuit, the method comprising:

transmitting a synchronized data signal and an associated clock signal to a data port and a clock port of the first printed circuit board;

transmitting the data signal to a data port of the second printed circuit board;

introducing a time delay in the clock signal during transmission of the clock signal to a clock port of the second printed circuit board, thereby creating a delayed clock signal;

transmitting the data signal and the delayed clock signal to a data port and a clock port of the memory device in electrical connection with the second printed circuit board; and capturing a stable data signal within the memory device when an associated delayed clock signal changes states at the clock port of the memory device.

22. The method of claim 21, wherein the step of introducing the time delay in the clock signal further comprises:

transmitting the data signal to the second printed circuit board via a data line of an interconnect cable; and transmitting the clock signal to the second printed circuit board via a clock line of an interconnect cable, wherein the clock line of the interconnect cable has a length greater than a length of the data line of the interconnect cable.

23. The method of claim 21, wherein the step of capturing the stable data signal within the memory device further comprises:

capturing the stable data signal within a rising edge sensitive clocking memory device when a rising edge of an associated delayed clock signal is located at the clock port of the memory device.

24. The method of 21, wherein the step of capturing the stable data signal within the memory device further comprises:

capturing the stable data signal within a falling edge sensitive clocking memory device when a falling edge of an associated delayed clock signal is located at the clock port of the memory device.

* * * * *